(12) United States Patent  (10) Patent No.: US 9,171,941 B2
Yoo et al.  (45) Date of Patent: Oct. 27, 2015

(54) FABRICATING METHOD OF THIN FILM TRANSISTOR, FABRICATING METHOD OF ARRAY SUBSTRATE AND DISPLAY DEVICE

(71) Applicant: BOE Technology Group Co., Ltd., Beijing (CN)

(72) Inventors: Seongyeol Yoo, Beijing (CN); Yoonsung Um, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/028,667

(22) Filed: Sep. 17, 2013

(65) Prior Publication Data

US 2014/0080254 A1  Mar. 20, 2014

(30) Foreign Application Priority Data

Sep. 17, 2012 (CN) .......................... 2012 1 0345262

(51) Int. Cl.
  *H01L 21/00* (2006.01)
  *H01L 29/66* (2006.01)
  *H01L 29/786* (2006.01)
  *H01L 27/12* (2006.01)

(52) U.S. Cl.
  CPC ...... *H01L 29/66969* (2013.01); *H01L 27/1225* (2013.01); *H01L 29/7869* (2013.01)

(58) Field of Classification Search
  None
  See application file for complete search history.

(56) References Cited

U.S. PATENT DOCUMENTS

| 8,741,702 | B2 * | 6/2014 | Ito et al. .......................... | 438/149 |
| 2002/0054268 | A1 * | 5/2002 | Kim et al. ...................... | 349/158 |
| 2005/0124088 | A1 | 6/2005 | Chen | |
| 2008/0096332 | A1 * | 4/2008 | Lee et al. ....................... | 438/151 |
| 2008/0248617 | A1 * | 10/2008 | Jeong et al. ................... | 438/160 |
| 2008/0318368 | A1 | 12/2008 | Ryu et al. | |
| 2009/0045402 | A1 * | 2/2009 | Kuo ............................... | 257/59 |

(Continued)

FOREIGN PATENT DOCUMENTS

| CN | 101685229 A | 3/2010 |
| CN | 101728277 A | 6/2010 |

(Continued)

OTHER PUBLICATIONS

First Office Action issued by the Chinese Patent Office for Chinese Patent Application No. 201210345262.2 dated Jul. 15, 2014, 7pgs.
English translation of First Office Action issued by the Chinese Patent Office for Chinese Patent Application No. 201210345262.2 dated Jul. 15, 2014, 7pgs.

(Continued)

*Primary Examiner* — Charles Garber
*Assistant Examiner* — Evren Seven (57) ABSTRACT

An embodiment of the present invention provides a fabricating method of a thin film transistor, a fabricating method of an array substrate, and a display device. The fabricating method of a thin film transistor comprises: forming a gate electrode on a substrate; and forming a gate insulating layer, a semiconductor layer, source and drain electrodes and a channel region on the substrate, wherein, the semiconductor layer is formed of a metal oxide, and two etching steps are used to form the channel region, and in a first etching step, a part of a source-drain metal layer above the semiconductor layer corresponding to the channel region is removed by using a dry etching, and in a second etching step, a remaining part of the source-drain metal layer above the semiconductor layer corresponding to the channel region is removed by using a wet etching, thereby forming the channel region.

18 Claims, 8 Drawing Sheets

(56) References Cited

U.S. PATENT DOCUMENTS

| | | | |
|---|---|---|---|
| 2010/0075450 A1 | 3/2010 | Choi et al. | |
| 2010/0105163 A1* | 4/2010 | Ito et al. | 438/104 |
| 2012/0012836 A1 | 1/2012 | Sasagawa et al. | |
| 2012/0080677 A1* | 4/2012 | Lee et al. | 257/57 |
| 2012/0217500 A1* | 8/2012 | Park et al. | 257/59 |
| 2013/0037807 A1* | 2/2013 | Fukaya | 257/57 |
| 2014/0134809 A1* | 5/2014 | Bai et al. | 438/158 |

FOREIGN PATENT DOCUMENTS

| | | | |
|---|---|---|---|
| EP | 2546224 | A1 | 1/2013 |
| TW | 201218280 | A | 5/2012 |
| WO | 2011086905 | A1 | 7/2011 |

OTHER PUBLICATIONS

Extended European Search Report for European Patent Application No. 13184677.6 dated Dec. 17, 2013, 10pgs.

Second Office Action from the State Intellectual Property Office of the People's Republic of China in Chinese Application No. 201210345262.2; dated Mar. 19, 2015; 8 pages.

English translation of Second Office Action from the State Intellectual Property Office of the People's Republic of China in Chinese Application No. 201210345262.2; dated Mar. 19, 2015; 9 pages.

English Abstract of CN101685229A (listed above under Foreign Patent Documents); 1 page.

English Abstract of CN101728277A (listed above under Foreign Patent Documents); 1 page.

* cited by examiner

FABRICATING METHOD OF THIN FILM TRANSISTOR, FABRICATING METHOD OF ARRAY SUBSTRATE AND DISPLAY DEVICE

CROSS REFERENCE TO RELATED APPLICATIONS

This application claims priority from Chinese National Application No. 201210345262.2 filed on Sep. 17, 2012, the contents of which are incorporated herein by reference.

TECHNICAL FIELD

Embodiments of the present invention relate to a fabricating method of a thin film transistor, a fabricating method of an array substrate and a display device.

BACKGROUND

A metal oxide thin film transistor has been paid much attention due to its high mobility and good uniformity and has become a hot research topic recently. The fabrication of an array substrate comprising the metal oxide thin film transistor can be completed by using four patterning processes, specifically comprising: forming a gate electrode and a gate line on a substrate by using a first patterning process; forming a gate insulating layer; forming a pattern of a semiconductor layer, a source electrode, a drain electrode, a data line and a channel of a thin film transistor (TFT) on the gate insulating layer by using a second patterning process; forming a passivation layer in which a via hole is formed by using a third patterning process; forming a pixel electrode being connected with the drain electrode through the via hole by using a fourth patterning process.

The second patterning process specifically comprises: sequentially forming a semiconductor thin film and a source-drain metal layer on the gate insulating layer; coating a photoresist on the source-drain metal layer; using a gray tone or half tone mask to expose and develop the photoresist to form a photoresist-completely-retained region, a photoresist-partially-retained region and a photoresist-completely-removed region, wherein, the photoresist-completely-retained region corresponds to a source electrode region and a drain electrode region, the photoresist-partially-retained region corresponds to a TFT channel region, and the photoresist-completely-removed region corresponds to regions other than the photoresist-completely-retained region and the photoresist-partially-retained region; using an etching process to remove the source-drain metal layer in the photoresist-completely-removed region and the semiconductor thin film below the source-drain metal layer to form the pattern of the semiconductor layer; using an ashing process to remove the photoresist in the photoresist-partially-retained region; removing the source-drain metal layer in the photoresist-partially-retained region by using an etching process, and forming the source electrode, the drain electrode, the data line and the channel region.

When the etching process is used to remove the source-drain metal layer in the photoresist-partially-retained region, as the substrate has a certain thickness, etching end points at different positions of the substrate judged by an etching EPD (End Point Detector) may not be consistent with each other, then a phenomenon of overetching the metal oxide semiconductor thin film in the channel region may occur. When a drying etching is used, an etching gas will react with the metal oxide and then take away oxygen ions in the metal oxide, so that the metal oxide becomes a conductor. When a wet etching is used, because of a relatively longer duration thereof, usually a high-concentration etching solution is used to reduce the etching duration, while the etching solution will react with the metal oxide and take away oxygen ions in the metal oxide, so that the metal oxide becomes a conductor. Therefore, regardless of using the dry etching or the wet etching, the metal oxide in the channel region may become a conductor, so that the transistor fails.

For the above problems, one solution is to form, corresponding to the TFT channel region, an ESL (Etching Stop Layer) above the metal oxide semiconductor layer, thus, during etching the source-drain metal layer, the ESL can protect the semiconductor layer in the TFT channel region. However, this requires an additional patterning process to form the ESL, and then makes the processes complex, the fabricating time long and the fabricating cost high.

SUMMARY

Embodiments of the present invention provide a fabricating method of a thin film transistor, a fabricating method of an array substrate, and a display device, thus a metal oxide semiconductor layer in the channel region can be protected without forming an ESL.

An embodiment of the present invention provides a fabricating method of a thin film transistor, comprising: forming a gate electrode on a substrate; and forming a gate insulating layer, a semiconductor layer, a source electrode, a drain electrode and a channel region on the substrate on which the gate electrode is formed, wherein, the semiconductor layer is formed of a metal oxide, and two etching steps are used to form the channel region, and in a first etching step, a part of a source-drain metal layer above the semiconductor layer corresponding to the channel region is removed by using a dry etching, and in a second etching step, a remaining part of the source-drain metal layer above the semiconductor layer corresponding to the channel region is removed by using a wet etching, thereby forming the channel region.

An embodiment of the present invention provides a fabricating method of an array substrate, comprising: forming a gate electrode and a gate line on a substrate; forming a gate insulating layer, a semiconductor layer, a source electrode, a drain electrode, a data line and a channel region on the substrate with the gate electrode and the gate line formed thereon, wherein, the semiconductor layer is formed of a metal oxide, and two etching steps are used to form the channel region, and in a first etching step, a part of a source-drain metal layer above the semiconductor layer corresponding to the channel region is removed by using a dry etching, and in a second etching step, a remaining part of the source-drain metal layer above the semiconductor layer corresponding to the channel region is removed by using a wet etching, thereby forming the channel region; depositing a passivation layer and forming a via hole in the passivation layer; and forming a pixel electrode connected with the drain electrode through the via hole.

An embodiment of the present invention provides a display device comprising an array substrate which is fabricated by using the above fabricating method.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In view of the problem in the prior art that when a metal oxide thin film transistor is fabricated, a metal oxide of a TFT channel region may become a conductor regardless of using a dry etching or a wet etching so that the thin film transistor fails, an embodiment of the present invention provides a fabricating method of a thin film transistor and a fabricating method of an array substrate, and a semiconductor layer of the thin film transistor is formed of a metal oxide, and the fabricating method uses two etching steps to form a channel region, wherein in a first etching step, a part of a source-drain metal layer above the semiconductor layer corresponding to the channel region is removed by using a dry etching and the semiconductor layer below the source-drain metal layer is not damaged, and in a second etching step, a remaining part of the source-drain metal layer above the semiconductor layer corresponding to the channel region is removed by using a wet etching, as a thinned source-drain metal layer is etched, a etching duration can be shortened obviously, a overetching amount of the semiconductor layer can be reduced, and basically the semiconductor layer will not be damaged, thereby effectively protecting the metal oxide semiconductor layer of the TFT channel region. Herein, the metal oxide can be InGaZnO, InGaO, ITZO, AlZnO or a combination of two or more selected from the oxides.

The fabricating method of a thin film transistor according to an embodiment of the present invention may comprise following steps:

Step 101, forming a gate electrode on a substrate;

Firstly, a gate metal layer is formed on a glass substrate or other types of transparent substrates by using a sputtering method, a thermal evaporation method or other film forming methods, and the gate metal layer may be made of Cr, Mo, Al, Cu, W, Nd or an alloy thereof and may be formed to be one layer or a plurality of layers; then, coating a photoresist on the gate metal layer; using a mask to expose and develop the photoresist to form a photoresist-completely-retained region and a photoresist-completely-removed region, wherein, the photoresist-completely-retained region corresponds to a gate electrode region, and the photoresist-completely-removed region corresponds to regions other than the photoresist-completely-retained region; using an etching process to remove the gate metal layer in the photoresist-completely-removed region; and finally, removing the photoresist in the photoresist-completely-retained region to form the gate electrode.

Step 102: forming a gate insulating layer, a semiconductor layer, a source electrode, a drain electrode and a channel region on the substrate with the gate electrode formed thereon, and the channel region is formed by using two etching steps, wherein in a first etching step, a part of a source-drain metal layer above the semiconductor layer corresponding to the channel region is removed by using a dry etching, and in a second etching step, a remaining part of the source-drain metal layer above the semiconductor layer corresponding to the channel region is removed by using a wet etching, thereby forming the channel region.

Exemplarily, the step 102 may comprise following steps:

Step 1021, sequentially forming the gate insulating layer, a semiconductor thin film and the source-drain metal layer on the substrate with the gate electrode formed thereon;

Firstly, methods such as a PECVD (Plasma Enhanced Chemical Vapor Deposition) method can be used to deposit the gate insulating layer on the substrate obtained after the step 101 is finished, and a material of the gate insulating layer can be an oxide (such as, $SiO_x$), a nitride (such as, $SiN_x$) and the like.

Then, methods such as a PECVD method can be used to deposit the semiconductor thin film on the gate insulating layer, a metal oxide can be selected for the semiconductor thin film, and the metal oxide can be InGaZnO, InGaO, ITZO, AlZnO or a combination of two or more selected from the oxides.

Finally, the source-drain metal layer is deposited on the semiconductor thin film by using a sputtering method, a thermal evaporation method or other film forming methods, and the source-drain metal layer may made of Cr, Mo, Al, Cu, W, Nd or an alloy thereof and may be formed to be one layer or a plurality of layers.

Step 1022, coating a photoresist on the source-drain metal layer, using a gray tone or half tone mask to expose and develop the photoresist and then using an etching process to form the semiconductor layer;

Firstly, coating the photoresist on the source-drain metal layer, using the gray tone or half tone mask patterned to expose and develop the photoresist to form a photoresist-completely-retained region, a photoresist-partially-retained region and a photoresist-completely-removed region, wherein, the photoresist-completely-retained region corresponds to a source electrode region and a drain electrode region, the photoresist-partially-retained region corresponds to the channel region, and the photoresist-completely-removed region corresponds to regions other than the photoresist-completely-retained region and the photoresist-partially-retained region; finally, using an etching process to remove the source-drain metal layer in the photoresist-completely-removed region and the semiconductor thin film below the source-drain metal thin film to form the semiconductor layer.

Step 1023, using an ashing process to remove the photoresist in the photoresist-partially-retained region;

The photoresist in the photoresist-partially-retained region can be removed through the ashing process, and the photoresist in the photoresist-completely-retained region is thinned, thereby exposing the source-drain metal layer corresponding to the channel region.

Step 1024, removing a part of the source-drain metal layer in the photoresist-partially-retained region by using a drying etching;

This is a first etching step among two etching steps of the source-drain metal layer. An etching duration can be set according to a thickness of the source-drain metal layer and an etching speed of the dry etching. For example, the etching duration can be set so that 70-90% of the source-drain metal layer is etched away.

In this step, as not all of the source-drain metal layer is etched away, an etching gas can not react with the metal oxide semiconductor below the source-drain metal layer, and thus the semiconductor layer can not be damaged.

Step 1025, removing a remaining part of the source-drain metal layer in the photoresist-partially-retained region by using a wet etching;

This is a second etching step among the two etching steps of the source-drain metal layer. Likewise, an etching duration can be set according to a thickness of the remaining source-drain metal layer and an etching speed of the wet etching, so that the remaining part of the source-drain metal layer is completely etched away within the etching duration, and also, an overetching amount of the semiconductor layer below the source-drain metal layer is not too large.

As the thinned source-drain metal layer is etched, the etching duration can be shortened obviously, the overetching amount of the semiconductor layer will also be reduced, and the semiconductor layer can not be substantially damaged, thereby effectively protecting the metal oxide semiconductor in the channel region.

In this step, an etching solution not containing $H_2O_2$, $H_2SO_4$ and $CH_3COOH$ may be used in the wet etching, as they will damage the metal oxide semiconductor; in addition, the etching solution may be mixed with a little amount of $HNO_3$, $H3PO_4$, HCL and etc.

Step 1026, removing the photoresist in the photoresist-completely-retained region to form the source electrode, the drain electrode, and the channel region.

Figure 10:
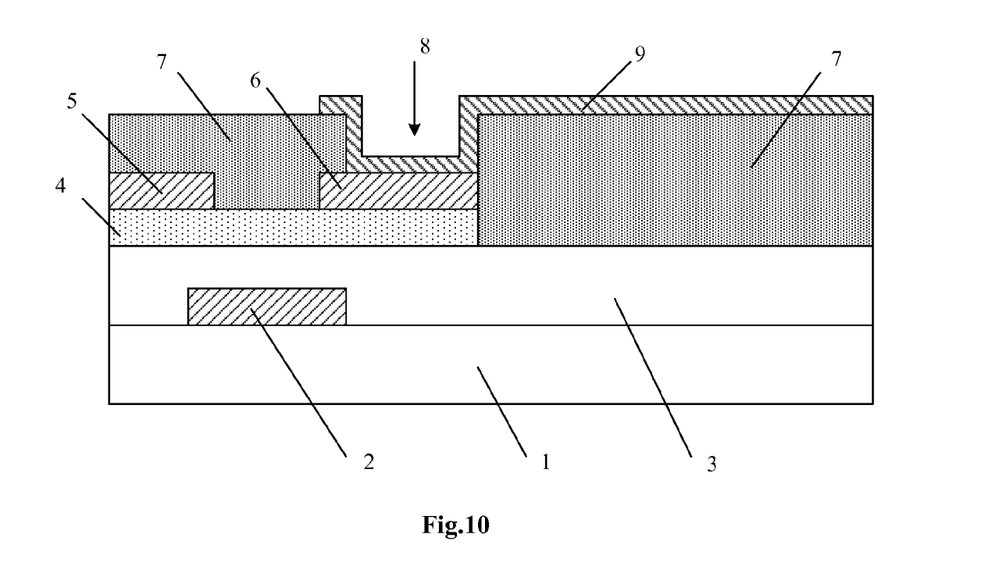
Figure 91:
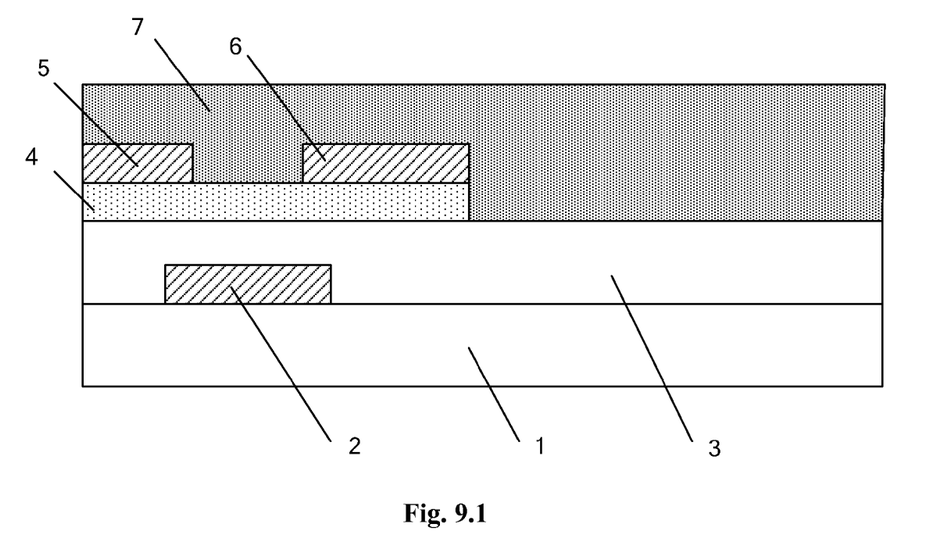
Figure 92:
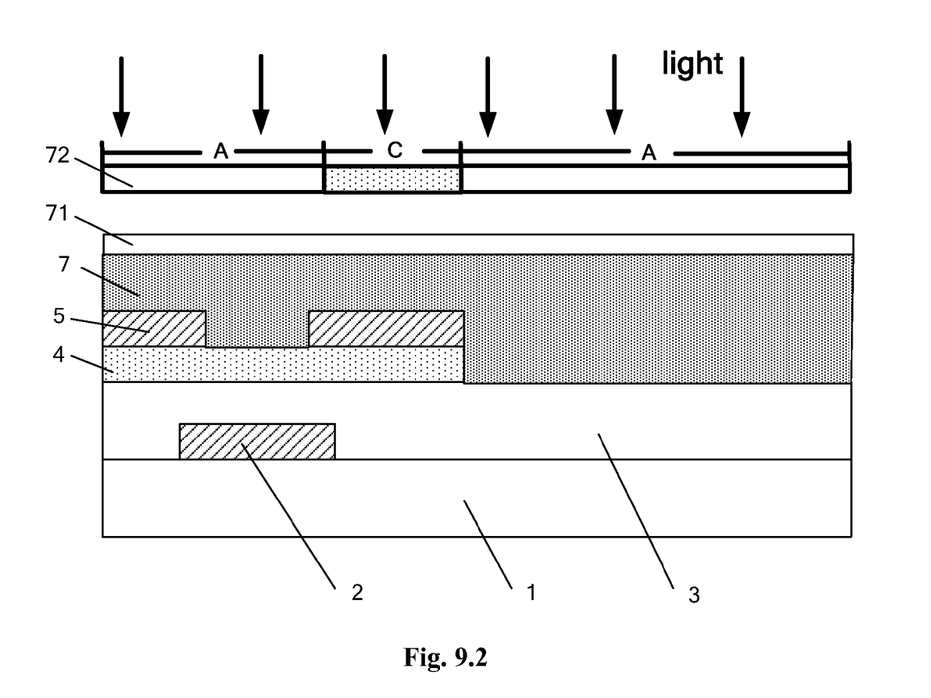
Figure 93:
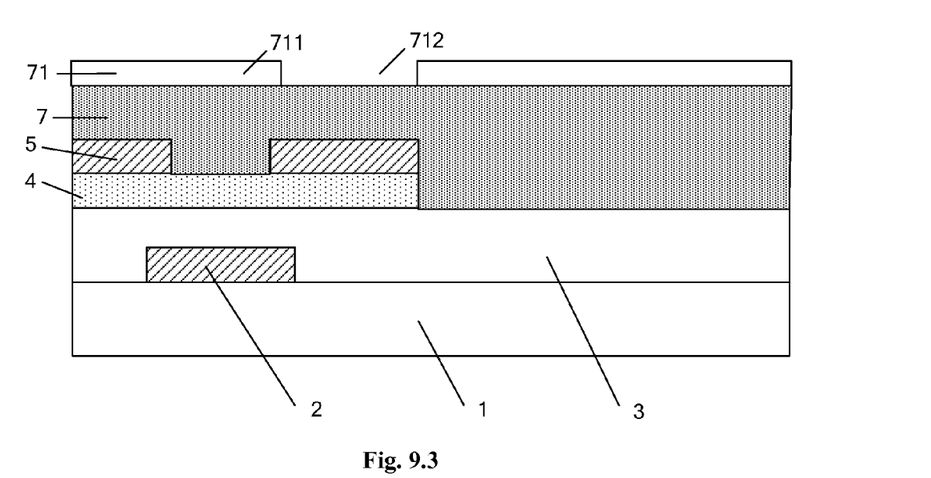
Figure 101:
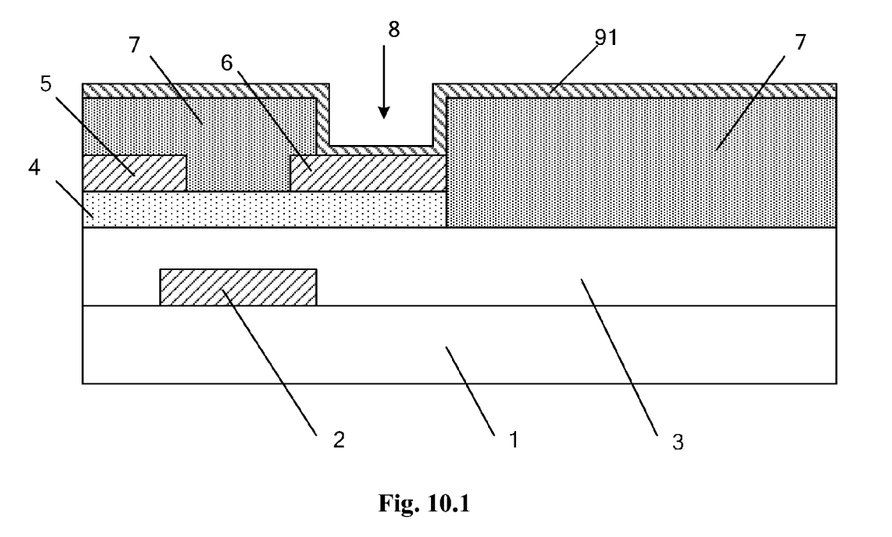
Figure 102:
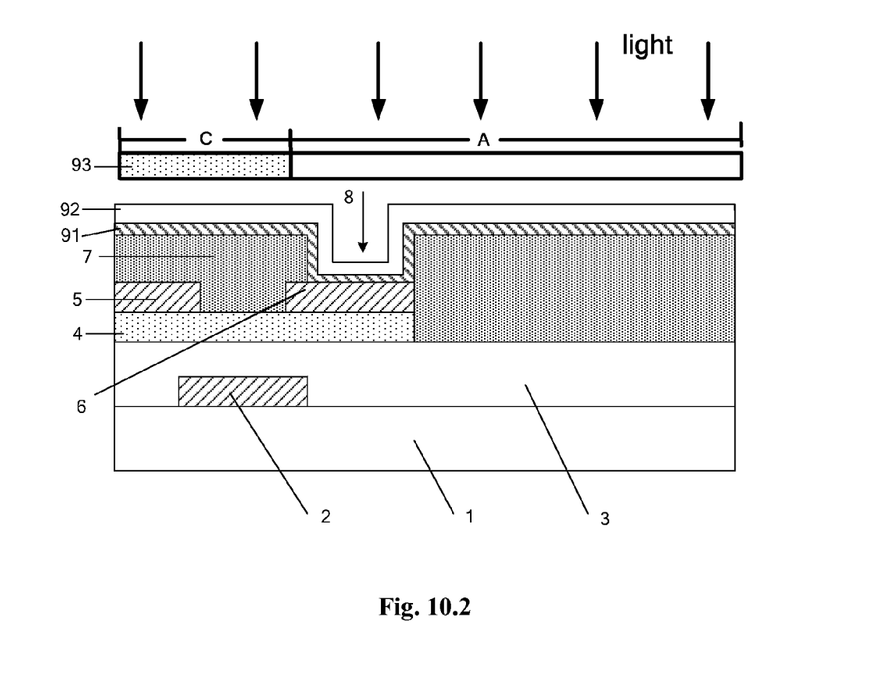
Figure 103:
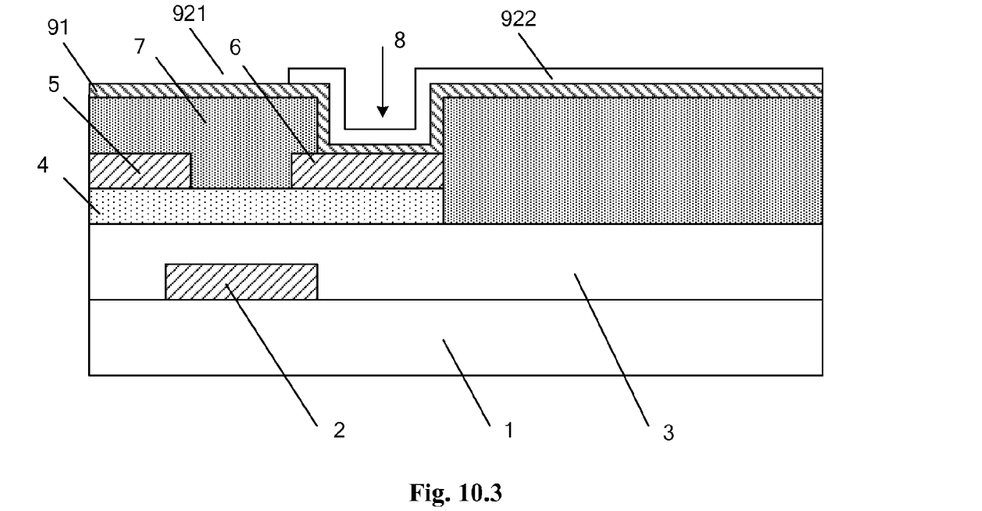

Furthermore, an array substrate of a liquid crystal display panel may use a metal oxide thin film transistor, and the above fabricating method of a thin film transistor can also be used in fabricating the array substrate. Referring to FIG. 10, the array substrate according to an embodiment of the present invention comprises: a substrate 1; a gate electrode 2 and a gate line (not shown) on the substrate 1; a gate insulating layer 3 above the gate electrode 2 and the gate line and covering the overall substrate 1; a semiconductor layer 4 on the gate insulating layer 3, and the semiconductor layer 4 may be made of a metal oxide, and the metal oxide may be InGaZnO, InGaO, ITZO, AlZnO or a combination of two or more selected from the oxides; a source electrode 5, a drain electrode 6 and a data line (not shown) on the semiconductor layer 4; a passivation layer 7 above the source electrode 5, the drain electrode 6 and the data line and covering the overall substrate 1, and a via hole 8 is formed in the passivation layer 7; and a pixel electrode 9 above the passivation layer 7 and connected with the drain electrode 6 through the via hole 8.

Figure 1:
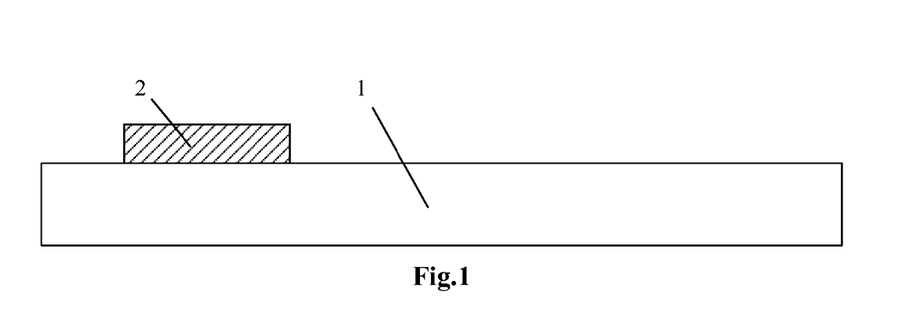
FIGS. 1-10 are cross-sectional views of each step in a fabricating method of an array substrate according to an embodiment of the present invention.

The fabrication of the above array substrate according to an embodiment of the present invention will be described hereinafter referring to FIGS. 1-10, comprising following steps:

Step S1, forming a gate electrode and a gate line on a substrate;

As shown in FIG. 1, a gate metal layer is formed on a substrate 1 by using a sputtering method, a thermal evaporation method or other film forming methods, and the gate metal layer may be made of Cr, Mo, Al, Cu, W, Nd or an alloy thereof and may be formed to be one layer or a plurality of layers; then, coating a photoresist on the gate metal layer; using a mask to expose and develop the photoresist to form a photoresist-completely-retained region and a photoresist-completely-removed region, wherein, the photoresist-completely-retained region corresponds to a gate electrode region and a gate line region, and the photoresist-completely-removed region corresponds to regions other than the photoresist-completely-retained region; using an etching process to remove the gate metal layer in the photoresist-completely-removed region; and finally, removing the photoresist in the photoresist-completely-retained region to form the gate electrode 2 and the gate line.

Step S2, forming a gate insulating layer, a semiconductor layer, a source electrode, a drain electrode and a channel region on the substrate with the gate electrode and the gate line formed thereon, and the channel region is formed by using two etching steps, wherein in a first etching step, a part of a source-drain metal layer above the semiconductor layer corresponding to the channel region is removed by using a dry etching, and in a second etching step, a remaining part of the source-drain metal layer above the semiconductor layer corresponding to the channel region is removed by using a wet etching, thereby forming the channel region.

Figure 2:
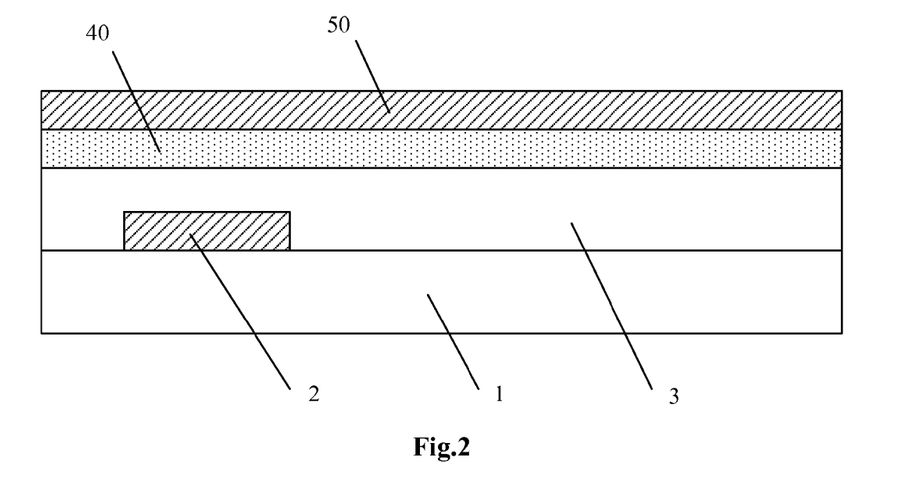

Exemplarily, the step S2 can comprise following steps:

Step S21, sequentially forming the gate insulating layer, a semiconductor thin film and the source-drain metal layer on the substrate obtained after the step S1;

As shown in FIG. 2, methods such as a PECVD (Plasma Enhanced Chemical Vapor Deposition) method can be used to deposit the gate insulating layer 3 on the substrate obtained after the step S1 is finished, and a material of the gate insulating layer can be an oxide (such as, $SiO_x$), a nitride (such as, $SiN_x$) and the like.

Then, methods such as a PECVD method can be used to deposit the semiconductor thin film 40 on the gate insulating layer 3, a metal oxide can be selected for the semiconductor thin film 40, and the metal oxide can be InGaZnO, InGaO, ITZO, AlZnO or a combination of two or more selected from the oxides.

Finally, the source-drain metal layer 50 is deposited on the semiconductor thin film 40 by using a sputtering method, a thermal evaporation method or other film forming methods, and the source-drain metal layer 50 may made of Cr, Mo, Al, Cu, W, Nd or an alloy thereof and may be formed to be one layer or a plurality of layers.

Figure 3:
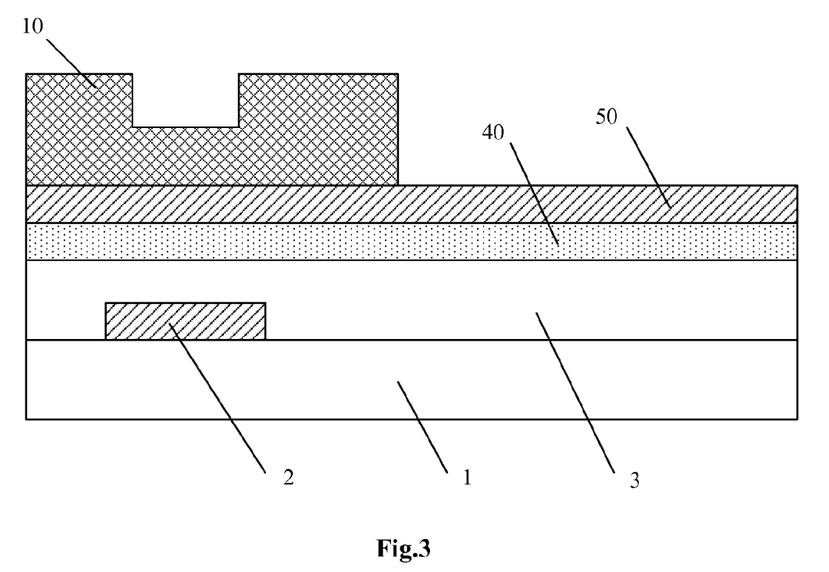
Figure 4:
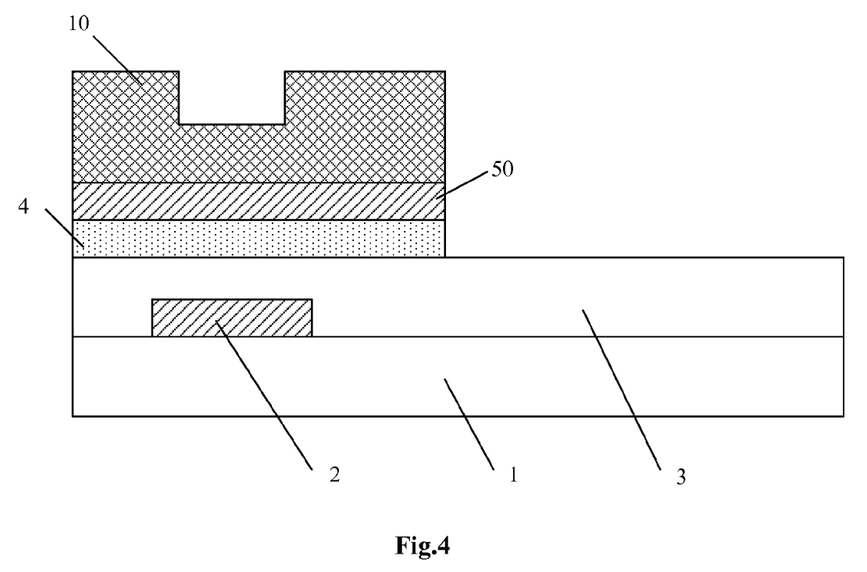

Step S22, coating a photoresist on the source-drain metal layer, using a gray tone or half tone mask to expose and develop the photoresist and then using an etching process to form the semiconductor layer;

As shown in FIGS. 3 and 4, firstly, coating the photoresist on the source-drain metal layer, using the gray tone or half tone mask patterned to expose and develop the photoresist to form a photoresist-completely-retained region, a photoresist-partially-retained region and a photoresist-completely-removed region, wherein, the photoresist-completely-retained region corresponds to a source electrode region and a drain electrode region, the photoresist-partially-retained region corresponds to the channel region, and the photoresist-completely-removed region corresponds to regions other than the photoresist-completely-retained region and the photoresist-partially-retained region; finally, using an etching process to remove the source-drain metal layer in the photoresist-completely-removed region and the semiconductor thin film below the source-drain metal thin film to form the semiconductor layer.

Figure 5:
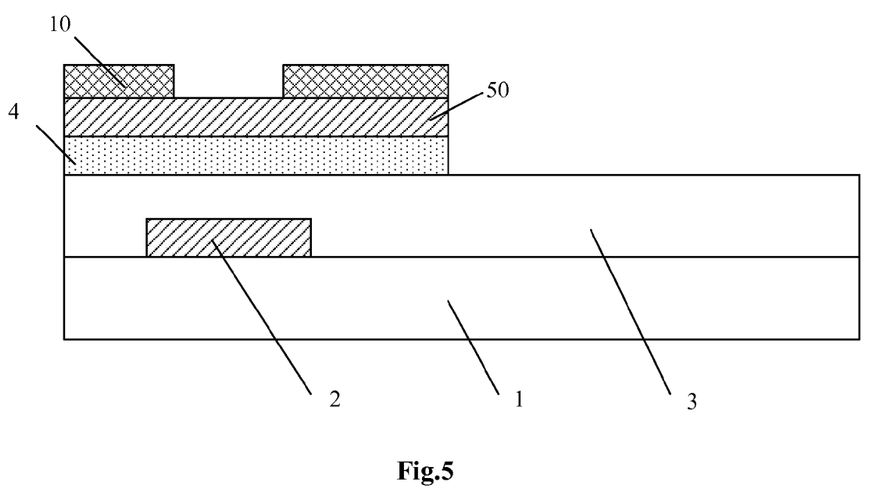

Step S23, using an ashing process to remove the photoresist in the photoresist-partially-retained region;

As shown in FIG. 5, the photoresist in the photoresist-partially-retained region can be removed by using the ashing process, and the photoresist in the photoresist-completely-retained region is thinned, thereby exposing the source-drain metal layer corresponding to the channel region.

Figure 6:
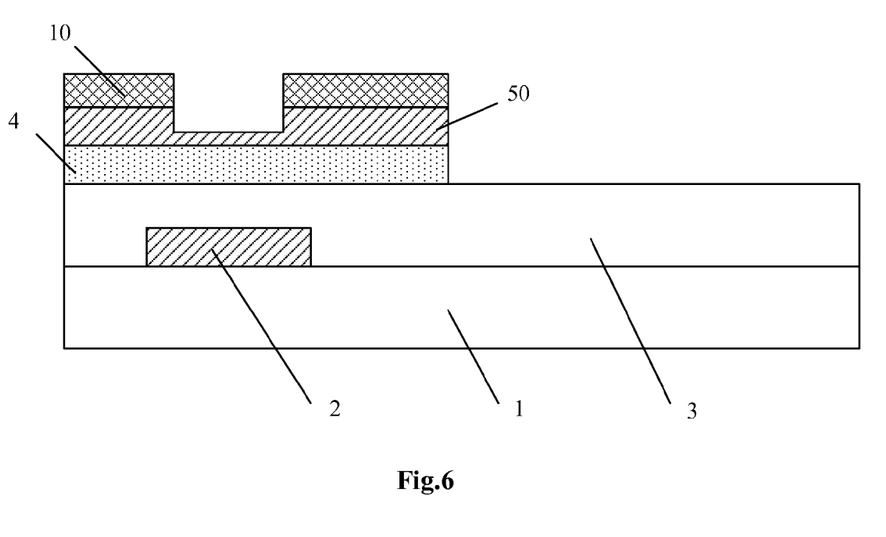

Step S24, removing a part of the source-drain metal layer in the photoresist-partially-retained region by using a drying etching (as shown in FIG. 6);

This is a first etching step among the two etching steps of the source-drain metal layer. An etching duration can be set according to a thickness of the source-drain metal layer and an etching speed of the dry etching. For example, the etching duration can be set so that 70-90% of the source-drain metal layer is etched away.

In this step, as not all of the source-drain metal layer is etched away, an etching gas can not react with the metal oxide semiconductor below the source-drain metal layer, and thus the semiconductor layer can not be damaged.

Figure 7:
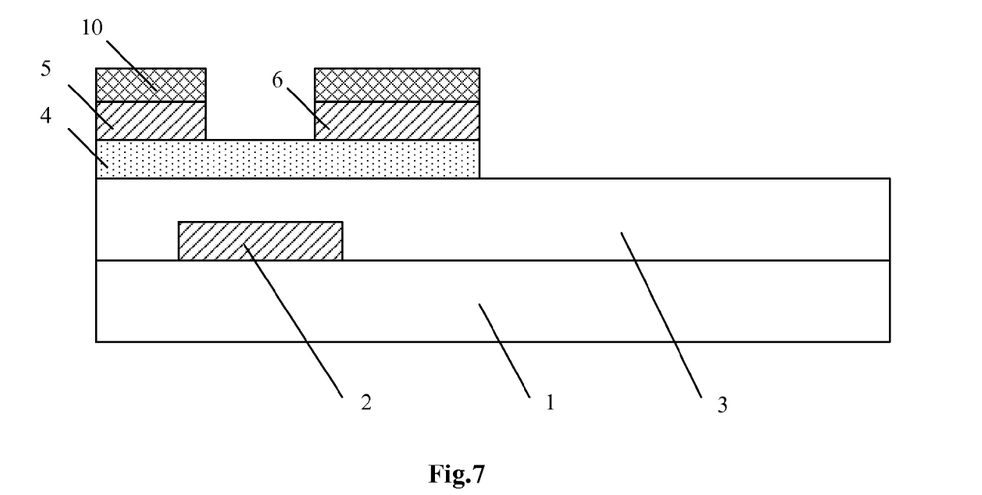

Step S25, removing a remaining part of the source-drain metal layer in the photoresist-partially-retained region by using a wet etching;

This is a second etching step among the two etching steps of the source-drain metal layer, as shown in FIG. 7, after the wet etching, the source electrode 5, the drain electrode 6 and the data line (not shown) are formed. Likewise, an etching duration can be set according to a thickness of the remaining source-drain metal layer and an etching speed of the wet etching, so that the remaining part of the source-drain metal layer is completely etched away within the etching duration, and also, an overetching amount of the semiconductor layer below the source-drain metal layer is not too large.

As the thinned source-drain metal layer is etched, the etching duration can be shortened obviously, the overetching amount of the semiconductor layer will also be reduced, and the semiconductor layer can not be substantially damaged, thereby effectively protecting the metal oxide semiconductor in the channel region.

In this step, an etching solution not containing $H_2O_2$, $H_2SO_4$ and $CH_3COOH$ may be used in the wet etching, as they will damage the metal oxide semiconductor; in addition, the etching solution may be mixed with a little amount of $HNO_3$, $H3PO_4$, HCL and etc.

Figure 8:
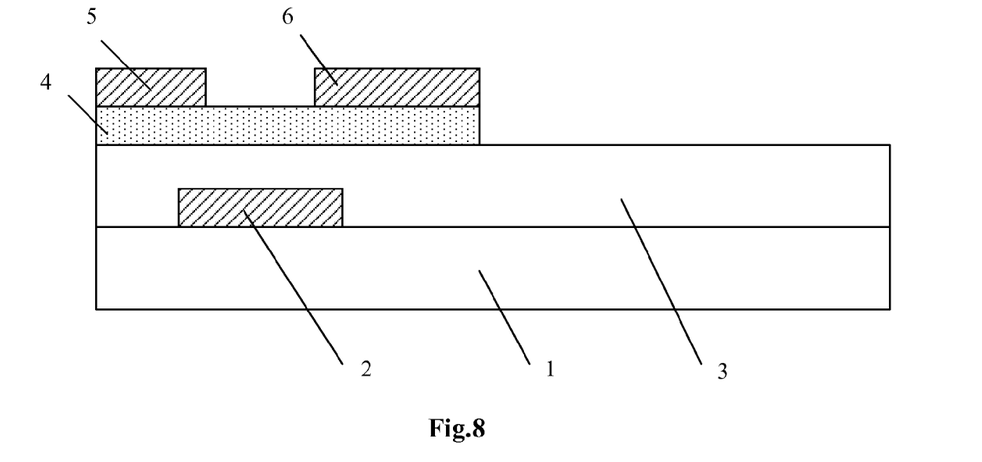

Step S26, removing the photoresist in the photoresist-completely-retained region to form the source electrode, the drain electrode, and the channel region (as shown in FIG. 8).

Figure 9:
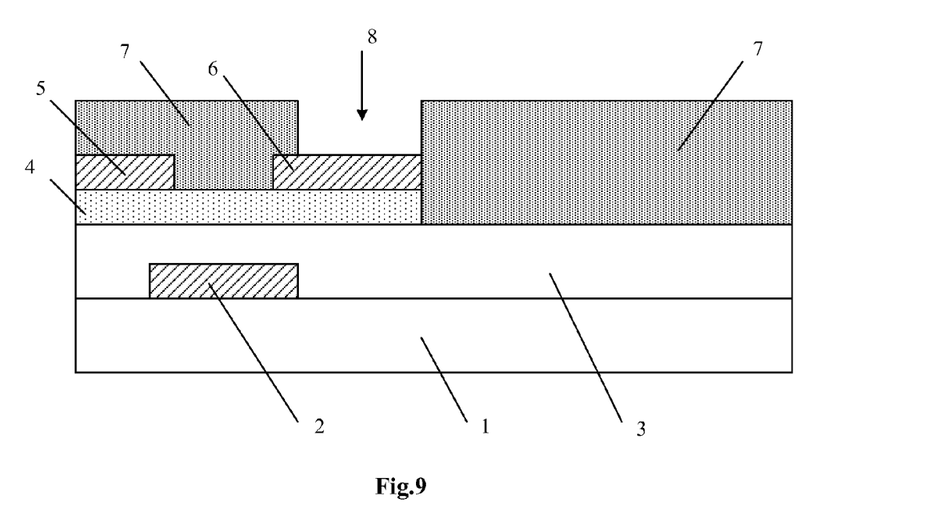

Step S3, depositing the passivation layer and forming a via hole in the passivation layer;

As shown in FIG. 9.1, FIG. 9.2, FIG. 9.3 and FIG. 9, firstly, methods such as a PECVD method can be used to deposit the passivation layer 7 on the substrate 1 obtained after the step S2 is finished, and a material such as $SiN_x$ or $SiO_x$ can be used for the passivation layer 7; then, coating a photoresist 71 on the passivation layer 7; using a mask 72 to expose and develop the photoresist 71 and then forming the photoresist-completely-retained region 711 and the photoresist-completely-removed region 712, wherein, the photoresist-completely-removed region 712 corresponds to a via hole region, and the photoresist-completely-retained region 711 corresponds to regions other than the photoresist-completely-removed region 712; then, using an etching process to remove the passivation layer 7 in the photoresist-completely-removed region 712 to expose the drain electrode 6 and form the via hole 8; and finally, removing the photoresist in the photoresist-completely-retained region.

Step S4, forming a pixel electrode which is connected with the drain electrode through the via hole.

As shown in FIG. 10.1, FIG. 10.2, FIG. 10.3 and FIG. 10, firstly, a transparent conductive layer 91 is formed on the substrate 1 obtained after the step S3 is finished by using a magnetron sputtering method, a thermal evaporation method or other film forming methods, and the transparent conductive layer 91 can use a material such as ITO, IZO and aluminum zinc oxide; then, coating a photoresist 92 on the transparent conductive layer 91; using a mask 93 to expose and develop the photoresist 92 to form a photoresist-completely-retained region 922 and a photoresist-completely-removed region 921, wherein, the photoresist-completely-retained region 922 corresponds to a pixel electrode region, and the photoresist-completely-removed region 921 corresponds to regions other than the photoresist-completely-retained region 922; then, using an etching process to remove the transparent conductive layer 91 in the photoresist-completely-removed region 921 to form the pixel electrode 9; and finally, removing the photoresist 92 in the photoresist-completely-retained region 922.

To sum up, the fabricating method according to an embodiment of the present invention uses two etching steps to form a channel region of a thin film transistor, wherein in a first etching step, a part of a source-drain metal layer above a semiconductor layer corresponding to the channel region is removed by using a dry etching and the semiconductor layer below the source-drain metal layer is not damaged, and in a second etching step, a remaining part of the source-drain metal layer above the semiconductor layer corresponding to the channel region is removed by using a wet etching, as a thinned source-drain metal layer is etched, a etching duration can be shortened obviously, a overetching amount of the semiconductor layer can be reduced, and basically the semiconductor layer will not be damaged, thereby effectively protecting the metal oxide semiconductor of the channel region.

An embodiment of the present invention further provides a display device, which comprises an array substrate fabricated according to the above fabricating method.

One example of the display device is a liquid crystal display device, wherein an array substrate and an opposite substrate are disposed to face each other to form a liquid crystal cell, and a liquid crystal material is filled in the liquid crystal cell. The opposite substrate is a color filter substrate, for example. The pixel electrode of each pixel unit of the array substrate is used to apply an electric field, so as to control a rotation of the liquid crystal material and to perform a displaying operation. In some examples, the liquid crystal display device further comprises a backlight source provided for the array substrate.

Another example of the display device is an organic light emitting display (OLED) device, wherein a pixel electrode of each pixel unit of the array substrate is used as an anode or a cathode to drive an organic light-emitting material to emit light so as to perform a displaying operation.

The display device can be applied to any product or part having a display function, such as television, electronic paper, digital photo frame, mobile phone, and tablet computer.

Compared with the prior art, fabricating methods of an array substrate and a thin film transistor according to the embodiments of the present invention use two etching steps to form a channel region, wherein in a first etching step, a part of a source-drain metal layer above a semiconductor layer corresponding to the channel region is removed by using a dry etching and the semiconductor layer below the source-drain metal layer is not damaged, and in a second etching step, a remaining part of the source-drain metal layer above the semiconductor layer corresponding to the channel region is removed by using a wet etching, as a thinned source-drain metal layer is etched, a etching duration can be shortened obviously, a overetching amount of the semiconductor layer can be reduced, and basically the semiconductor layer will not be damaged, thereby effectively protecting the metal oxide semiconductor of the channel region.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A fabricating method of a thin film transistor, comprising:
    forming a gate electrode on a substrate; and
    forming a gate insulating layer, a semiconductor layer, a source electrode, a drain electrode and a channel region on the substrate on which the gate electrode is formed, wherein, the semiconductor layer is formed of a metal oxide, and two etching steps are used to form the channel region, and in a first etching step, a source-drain metal layer above the semiconductor layer corresponding to the channel region is partially etched through by using a dry etching, and in a second etching step, the partially etched through part of the source-drain metal layer above the semiconductor layer corresponding to the channel region is completely etched through by using a wet etching.

2. The fabricating method of the thin film transistor according to claim 1, wherein, the forming the gate insulating layer, the semiconductor layer, the source electrode, the drain electrode and the channel region on the substrate on which the gate electrode is formed comprises:
    sequentially forming the gate insulating layer, a semiconductor thin film and the source-drain metal layer on the substrate with the gate electrode formed thereon;
    coating a photoresist on the source-drain metal layer, using a gray tone or half tone mask to expose and develop the photoresist to form a photoresist-completely-retained region, a photoresist-partially-retained region and a photoresist-completely-removed region, wherein, the photoresist-completely-retained region corresponds to a source electrode region and a drain electrode region, the photoresist-partially-retained region corresponds to the channel region, and the photoresist-completely-removed region corresponds to regions other than the photoresist-completely-retained region and the photoresist-partially-retained region;
    using an etching process to remove the source-drain metal layer in the photoresist-completely-removed region and the semiconductor thin film below the source-drain metal layer to form the semiconductor layer;
    using an ashing process to remove the photoresist in the photoresist-partially-retained region;
    removing a part of the source-drain metal layer in the photoresist-partially-retained region by using the drying etching;
    removing a remaining part of the source-drain metal layer in the photoresist-partially-retained region by using the wet etching; and
    removing the photoresist in the photoresist-completely-retained region to form the source electrode, the drain electrode and the channel region.

3. The fabricating method of the thin film transistor according to claim 1, wherein, the metal oxide is InGaZnO, InGaO, ITZO, AlZnO or a combination of two or more selected from the oxides.

4. The fabricating method of the thin film transistor according to claim 2, wherein, the metal oxide is InGaZnO, InGaO, ITZO, AlZnO or a combination of two or more selected from the oxides.

5. The fabricating method of the thin film transistor according to claim 1, wherein, in the wet etching, an etching solution not containing $H_2O_2$, $H_2SO_4$ and $CH_3COOH$ is used.

6. The fabricating method of the thin film transistor according to claim 2, wherein, in the wet etching, an etching solution not containing $H_2O_2$, $H_2SO_4$ and $CH_3COOH$ is used.

7. A fabricating method of an array substrate, comprising:
    forming a gate electrode and a gate line on a substrate;
    forming a gate insulating layer, a semiconductor layer, a source electrode, a drain electrode, a data line and a channel region on the substrate with the gate electrode and the gate line formed thereon, wherein, the semiconductor layer is formed of a metal oxide, and two etching steps are used to form the channel region, and in a first etching step, a source-drain metal layer above the semiconductor layer corresponding to the channel region is partially etched through by using a dry etching, and in a second etching step, the partially etched through part of the source-drain metal layer above the semiconductor layer corresponding to the channel region is completely etched through by using a wet etching;
    depositing a passivation layer and forming a via hole in the passivation layer; and
    forming a pixel electrode connected with the drain electrode through the via hole.

8. The fabricating method of the array substrate according to claim 7, wherein, the forming the gate insulating layer, the semiconductor layer, the source electrode, the drain electrode, the data line and the channel region on the substrate with the gate electrode and the gate line formed thereon comprises:
    sequentially forming the gate insulating layer, a semiconductor thin film and the source-drain metal layer on the substrate with the gate electrode and the gate line formed thereon;
    coating a photoresist on the source-drain metal layer, using a gray tone or half tone mask to expose and develop the photoresist to form a photoresist-completely-retained region, a photoresist-partially-retained region and a photoresist-completely-removed region, wherein, the photoresist-completely-retained region corresponds to a source electrode region and a drain electrode region, the photoresist-partially-retained region corresponds to the channel region, and the photoresist-completely-removed region corresponds to regions other than the photoresist-completely-retained region and the photoresist-partially-retained region;
    using an etching process to remove the source-drain metal layer in the photoresist-completely-removed region and the semiconductor thin film below the source-drain metal layer to form the semiconductor layer;
    using an ashing process to remove the photoresist in the photoresist-partially-retained region;
    removing a part of the source-drain metal layer in the photoresist-partially-retained region by using the drying etching;
    removing a remaining part of the source-drain metal layer in the photoresist-partially-retained region by using the wet etching; and
    removing the photoresist in the photoresist-completely-retained region to form the source electrode, the drain electrode and the channel region.

9. The fabricating method of the array substrate according to claim 7, wherein, the metal oxide is InGaZnO, InGaO, ITZO, AlZnO or a combination of two or more selected from the oxides.

10. The fabricating method of the array substrate according to claim 8, wherein, the metal oxide is InGaZnO, InGaO, ITZO, AlZnO or a combination of two or more selected from the oxides.

11. The fabricating method of the array substrate according to claim 7, wherein, in the wet etching, an etching solution not containing $H_2O_2$, $H_2SO_4$ and $CH_3COOH$ is used.

12. The fabricating method of the array substrate according to claim 8, wherein, in the wet etching, an etching solution not containing $H_2O_2$, $H_2SO_4$ and $CH_3COOH$ is used.

13. The fabricating method of the array substrate according to claim 7, wherein, the depositing the passivation layer and forming the via hole in the passivation layer comprises:
depositing the passivation layer on the substrate with the source electrode, the drain electrode, the data line and the channel region formed thereon;
coating a photoresist on the passivation layer;
using a mask to expose and develop the photoresist to form a photoresist-completely-retained region and a photoresist-completely-removed region, wherein, the photoresist-completely-removed region corresponds to a via hole region, and the photoresist-completely-retained region corresponds to regions other than the photoresist-completely-removed region;
using an etching process to remove the passivation layer in the photoresist-completely-removed region to expose the drain electrode and then form the via hole; and
removing the photoresist in the photoresist-completely-retained region.

14. The fabricating method of the array substrate according to claim 13, wherein, the passivation layer is formed of SiNx or SiOx.

15. The fabricating method of the array substrate according to claim 7, wherein, the forming the pixel electrode comprises:
forming a transparent conductive layer on the substrate with the source electrode, the drain electrode, the data line, the channel region and the passivation layer formed thereon;
coating a photoresist on the transparent conductive layer;
using a mask to expose and develop the photoresist to form a photoresist-completely-retained region and a photoresist-completely-removed region, wherein, the photoresist-completely-retained region corresponds to a pixel electrode region, and the photoresist-completely-removed region corresponds to regions other than the photoresist-completely-retained region;
using an etching process to remove the transparent conductive layer in the photoresist-completely-removed region to form the pixel electrode; and
removing the photoresist in the photoresist-completely-retained region.

16. The fabricating method of the array substrate according to claim 15, wherein, the transparent conductive layer is made from ITO, IZO or aluminum zinc oxide.

17. A display device, comprising an array substrate, wherein, the array substrate is fabricated by using the fabricating method according to claim 7.

18. The display device according to claim 17, wherein, the display device is a liquid crystal display device or an organic light emitting display device.

\* \* \* \* \*